(12) United States Patent
Chen et al.

(10) Patent No.: US 9,355,848 B2
(45) Date of Patent: May 31, 2016

(54) SEMICONDUCTOR STRUCTURE AND METHOD FOR FORMING THE SAME

(71) Applicant: UNITED MICROELECTRONICS CORP., Hsinchu (TW)

(72) Inventors: Wei-Chih Chen, Kaohsiung (TW);
Chung-Hsien Tsai, Tainan (TW);
Tung-Ming Chen, Kaohsiung (TW);
Chih-Sheng Chang, Kaohsiung (TW);
Jun-Chi Huang, Taichung (TW);
Chih-Jen Lin, Kaohsiung (TW);
Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 64 days.

(21) Appl. No.: 14/057,095

(22) Filed: Oct. 18, 2013

(65) Prior Publication Data

US 2015/0108587 A1    Apr. 23, 2015

(51) Int. Cl.

| | | |
|---|---|---|
| *H01L 21/336* | (2006.01) | |
| *H01L 21/28* | (2006.01) | |
| *H01L 29/423* | (2006.01) | |
| *H01L 21/265* | (2006.01) | |
| *H01L 29/66* | (2006.01) | |
| *H01L 29/78* | (2006.01) | |

(52) U.S. Cl.
CPC .... *H01L 21/28052* (2013.01); *H01L 21/28114* (2013.01); *H01L 29/6659* (2013.01); *H01L 21/2652* (2013.01); *H01L 29/42372* (2013.01); *H01L 29/665* (2013.01); *H01L 29/6656* (2013.01); *H01L 29/7843* (2013.01); *H01L 29/7847* (2013.01)

(58) Field of Classification Search
CPC .............. H01L 21/823807; H01L 21/823864; H01L 29/6653; H01L 29/7843; H01L 29/7833; H01L 29/66545; H01L 29/665; H01L 29/6656; H01L 29/6659; H01L 21/8238; H01L 27/092
See application file for complete search history.

(56) References Cited

U.S. PATENT DOCUMENTS

| | | | |
|---|---|---|---|
| 4,486,943 A | 12/1984 | Ryden et al. | |
| 6,534,354 B1 * | 3/2003 | Lee .................. | H01L 21/265 257/E21.334 |
| 2008/0206943 A1 * | 8/2008 | Chen et al. ............... | 438/229 |
| 2009/0294866 A1 * | 12/2009 | Eller et al. ............... | 257/369 |
| 2012/0196421 A1 | 8/2012 | Chang et al. | |
| 2012/0244700 A1 * | 9/2012 | Richter ............. | H01L 21/28052 438/664 |
| 2014/0131804 A1 * | 5/2014 | Chen et al. ............... | 257/368 |

* cited by examiner

*Primary Examiner* — Charles Garber
*Assistant Examiner* — Abdulfattah Mustapha
(74) *Attorney, Agent, or Firm* — WPAT, P.C.; Justin King

(57) ABSTRACT

A semiconductor structure and a method for forming the same are provided. The method includes following steps. A gate electrode layer is formed on a substrate. A spacer structure is formed on a sidewall of the gate electrode layer. A dielectric cap film is formed to cover the gate electrode layer and the spacer structure. A source/drain implantation is performed to the substrate with the dielectric cap film exposed to a condition of the source/drain implantation.

10 Claims, 4 Drawing Sheets

SEMICONDUCTOR STRUCTURE AND METHOD FOR FORMING THE SAME

BACKGROUND

1. Technical Field

The disclosure relates to a semiconductor structure and a method for forming the same, and more particularly to a semiconductor structure comprising a gate electrode and a method for forming the same

2. Description of the Related Art

With a trend of shrinking a line width of a semiconductor process, a size of a semiconductor structure, comprising for example a MOS transistor or a memory array, etc., has been scaled down. However, an accurate process is necessary for obtaining a fine critical size of a semiconductor process. Otherwise, a semiconductor device would have a low efficiency resulted from a process shift or a side effect in a manufacturing step.

SUMMARY

According to one embodiment, a method for forming a semiconductor structure is provided, comprising following steps. A gate electrode layer is formed on a substrate. A spacer structure is formed on a sidewall of the gate electrode layer. A dielectric cap film is formed to cover the gate electrode layer and the spacer structure. A source/drain implantation is performed to the substrate with the dielectric cap film exposed to a condition of the source/drain implantation.

According to another embodiment, a semiconductor structure is provided. The semiconductor structure comprises a substrate and a mushroom gate electrode. The mushroom gate electrode is on the substrate. The mushroom gate electrode has a stipe electrode portion and a pileus electrode portion on the stipe electrode portion. A width of a part of the pileus electrode portion beyond a sidewall of the stipe electrode portion is between 5 Å and 20 Å.

DETAILED DESCRIPTION

FIG. 1A to FIG. 1G illustrate a method for forming a semiconductor structure.

Figure 1A:
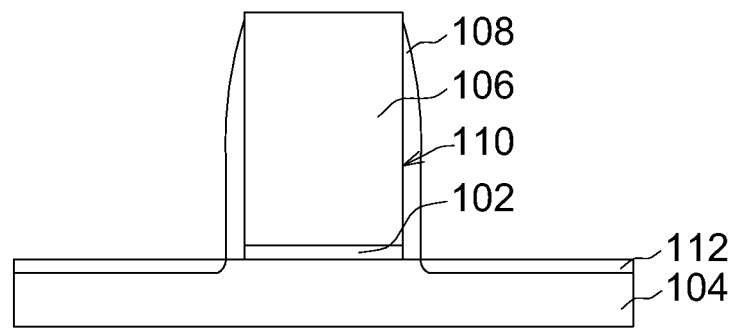
FIG. 1A to FIG. 1G illustrate a method for forming a semiconductor structure.

Referring to FIG. 1A, a gate dielectric layer 102 is formed on a substrate 104. The substrate 104 may comprise a silicon substrate, a SOI substrate, etc. A gate electrode layer 106 is formed on the gate dielectric layer 102. In embodiments, the gate electrode layer 106 comprises a polysilicon. A first spacer 108 is formed on a substantial vertical sidewall 110 of the gate electrode layer 106. In one embodiment, the first spacer 108 comprises a D-shape spacer. The first spacer 108 may be either a composite layer structure including a silicon oxide layer and a silicon nitride layer, or a pure silicon oxide layer. A lightly doped drain (LDD) 112 is formed in the substrate 104 by an implantation step using the first spacer 108 as a mask.

Figure 1B:
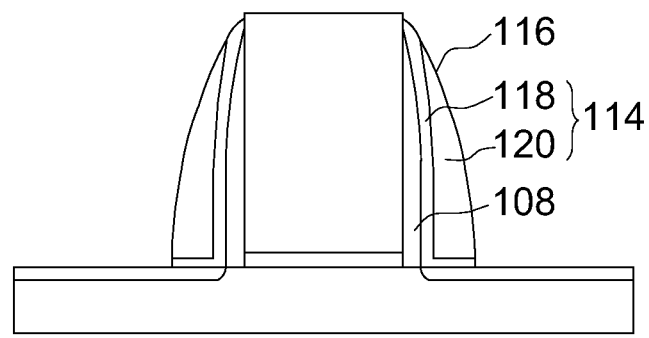

Referring to FIG. 1B, a second spacer 114 is formed on the first spacer 108 so as to form a spacer structure 116 comprising the first spacer 108 and the second spacer 114. In one embodiment, the second spacer 114 comprises a L-shape spacer 118 on the first spacer 108 and a D-shape spacer 120 on the L-shape spacer 118. The L-shape spacer 118 may comprise a silicon oxide layer. The D-shape spacer 120 may comprise a silicon nitride layer.

Figure 1C:
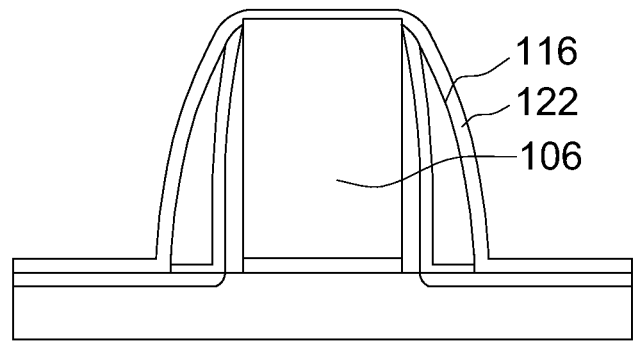

Referring to FIG. 1C, a dielectric cap film 122 is formed to cover the gate electrode layer 106 and the spacer structure 116. In one embodiment, the dielectric cap film 122 is an oxide film and a thickness of which is between 20 Å and 50 Å, for example 30 Å.

Figure 1D:
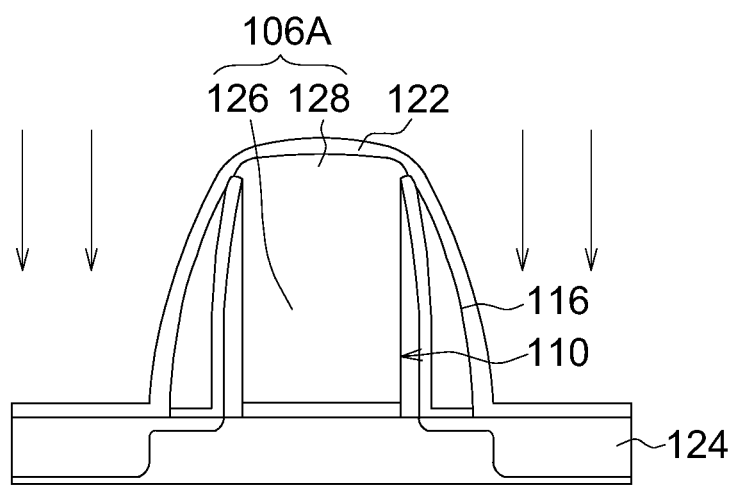

Referring to FIG. 1D, a source/drain 124 is formed in the substrate 104 by an implantation step using the dielectric cap film 122 as a mask. In embodiments, the dielectric cap film 122 is exposed to a condition of the source/drain implantation. In some embodiments, this source/drain implantation may slightly expands a volume of an upper portion of the gate electrode layer 106 (FIG. 1F) and forms a gate electrode layer 106A which may be regard as a mushroom gate electrode having a stipe electrode portion 126 and a pileus electrode portion 128 on and slightly wider than the stipe electrode portion 126.

Figure 1E:
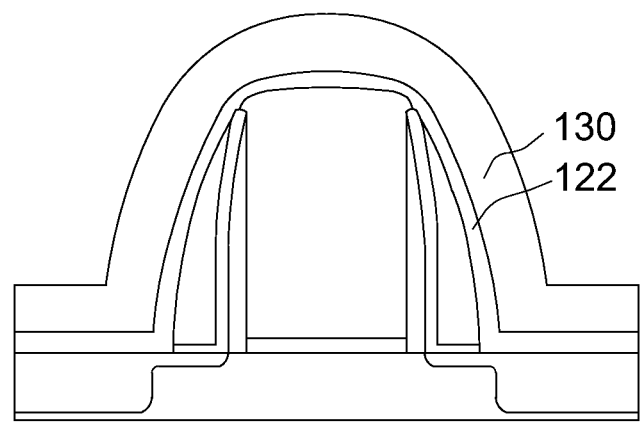

Referring to FIG. 1E, a stress film 130 is formed to cover the dielectric cap film 122. In one embodiment, the stress film 130 is a multi-layer film comprising an oxide film covering the dielectric cap film 122, and a nitride film covering the oxide film, but not limited thereto. Then, the structure as shown in FIG. 1E is subjected to an annealing step, such as rapid thermal process (RTP), laser anneal (LSA), etc.

Figure 1F:
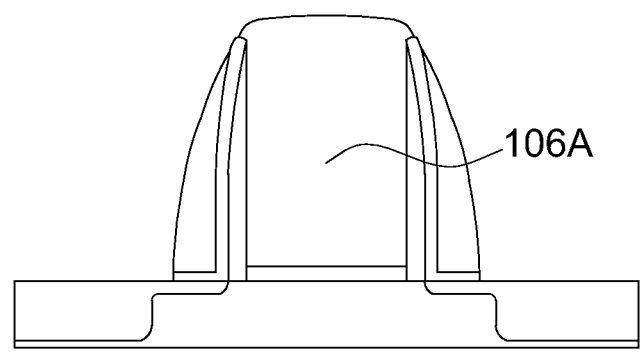

Referring to FIG. 1F, the stress film 130 (FIG. 1E) and the dielectric cap film 122 are removed.

Figure 1G:
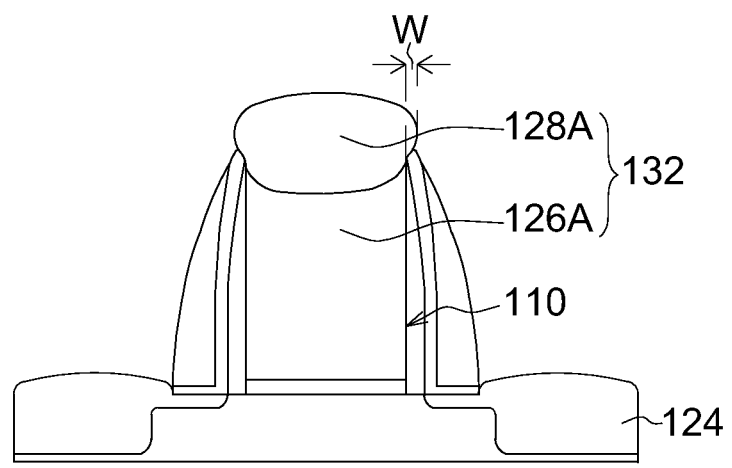

Referring to FIG. 1G, an upper portion of the gate electrode layer 106A (FIG. 1F) is salicideds. The source/drain 124 is preferably salicided simultaneously. In embodiments, this saliciding step expands a volume of an upper portion of the gate electrode layer 106A and forms a pileus electrode portion 128A, and therefore a mushroom gate electrode 132 is formed. The mushroom gate electrode 132 has a stipe electrode portion 126A and the pileus electrode portion 128A on the stipe electrode portion 126A. The stipe electrode portion 126A comprises a polysilicon, and the pileus electrode portion 128A comprises a metal silicide. The saliciding step may comprise steps of forming a metal layer (not shown) on an upper surface of the gate electrode layer 106A, annealing the metal layer and the gate electrode layer 106A, and removing the remained metal layer. In one embodiment, the metal silicide is NiSi. The metal silicide may comprise other suitable materials.

In embodiments, a width W of a part of the pileus electrode portion 128A beyond a sidewall 110 of the stipe electrode portion 126A (i.e. a lower portion of the sidewall 110 of the gate electrode layer 106 or 106A as shown in FIG. 1A or 1D) is small, for example, between 5 Å and 20 Å, such as 17 Å, and therefore a undesired short circuit between the mushroom gate electrode 132 and other adjacent conductive members such as a source/drain contact (not shown) passing through an interlayer dielectric film (not shown) to electrically connect to the source/drain 124 can be avoided. A void in the interlayer dielectric film between two adjacent mushroom gate electrodes 132 can also be avoided. In addition, the pileus electrode portion 128A has a low resistance, and can provide good electrical contact characteristics with the underlying stipe electrode portion 126A or other suitable conductive members such as a gate contact (not shown) designed to pass through the interlayer dielectric film (not shown) to electrically connect to the mushroom gate electrode 132. Therefore, product yield according to embodiments is high.

In comparative examples (not shown), which are different from embodiments in that there is no dielectric cap film covering a first spacer and a second spacer of a spacer structure and exposed to a condition of a source/drain implantation, a width of a part of a formed pileus electrode portion beyond a sidewall of a stipe electrode portion is bigger and ranges from 45 Å to 21 Å. Compared to embodiments of the present disclosure, comparative examples have more voids in an interlayer dielectric film, a higher resistance of a mushroom gate electrode, and a higher fail ratio of product.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
    forming a gate electrode layer on a substrate;
    forming a spacer structure on a sidewall of the gate electrode layer;
    forming a dielectric cap film to cover the gate electrode layer and the spacer structure;
    performing a source/drain implantation to the substrate with the dielectric cap film exposed to a condition of the source/drain implantation;
    removing the dielectric cap film after the source/drain implantation; and
    saliciding the gate electrode layer, wherein the dielectric cap film is removed before the saliciding step.

2. The method for forming the semiconductor structure according to claim 1, wherein the saliciding step expands an upper portion of the gate electrode layer to form a pileus electrode portion wider than the gate electrode layer.

3. The method for forming the semiconductor structure according to claim 1, wherein the saliciding step changes the gate electrode layer into a mushroom gate electrode having a stipe electrode portion and a pileus electrode portion on the stipe electrode portion.

4. The method for forming the semiconductor structure according to claim 3, wherein a width of a part of the pileus electrode portion beyond a sidewall of the stipe electrode portion is between 5 Å and 20 Å.

5. The method for forming the semiconductor structure according to claim 1, wherein a thickness of the dielectric cap film is between 20 Å and 50 Å.

6. The method for forming the semiconductor structure according to claim 1, wherein the spacer structure serves as a mask for the source/drain implantation.

7. The method for forming the semiconductor structure according to claim 1, wherein the spacer structure is formed by a method comprising:
    forming a first spacer on the sidewall of the gate electrode layer; and
    forming a second spacer on the first spacer.

8. The method for forming the semiconductor structure according to claim 7, further comprising forming a lightly doped drain (LDD) in the substrate by an implantation step using the first spacer as a mask.

9. The method for forming the semiconductor structure according to claim 1, further comprising:
    forming a stress film covering the dielectric cap film; and
    performing an annealing step to the substrate having the source/drain.

10. The method for forming the semiconductor structure according to claim 9, further comprising removing the stress film after the annealing step.

* * * * *